United States Patent
Park

(10) Patent No.: US 10,083,746 B2
(45) Date of Patent: Sep. 25, 2018

(54) MEMORY DEVICE AND METHOD FOR OPERATING MEMORY DEVICE

(71) Applicant: SAMSUNG ELECTRONICS CO., LTD., Suwon-si, Gyeonggi-Do (KR)

(72) Inventor: Mu Hui Park, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/683,876

(22) Filed: Aug. 23, 2017

(65) Prior Publication Data

US 2018/0166136 A1 Jun. 14, 2018

(30) Foreign Application Priority Data

Dec. 13, 2016 (KR) .................. 10-2016-0169944

(51) Int. Cl.
*G11C 11/00* (2006.01)
*G11C 13/00* (2006.01)

(52) U.S. Cl.
CPC ........ *G11C 13/0064* (2013.01); *G11C 13/004* (2013.01)

(58) Field of Classification Search
CPC .......................... G11C 13/0064; G11C 13/004
USPC ........................ 365/148, 185.25, 185.21, 204
See application file for complete search history.

(56) References Cited

U.S. PATENT DOCUMENTS

| | | | |
|---|---|---|---|
| 7,388,775 B2 | 6/2008 | Bedeschi et al. | |
| 7,646,633 B2 | 1/2010 | Fuji | |
| 8,036,013 B2 | 10/2011 | Lowrey et al. | |
| 8,040,723 B2* | 10/2011 | Sheu ..................... | G11C 7/14 365/148 |
| 8,259,515 B2 | 9/2012 | Bedeschi et al. | |
| 8,416,602 B2 | 4/2013 | Kitagawa et al. | |
| 8,792,270 B2 | 7/2014 | Parkinson | |
| 8,891,319 B2 | 11/2014 | Castro et al. | |
| 8,902,628 B2 | 12/2014 | Ha et al. | |
| 9,030,884 B2* | 5/2015 | Park ..................... | G11C 7/12 365/185.25 |
| 9,082,478 B2* | 7/2015 | Lee ..................... | G11C 13/004 |
| 9,123,400 B1 | 9/2015 | Yang et al. | |
| 9,443,586 B2* | 9/2016 | Park ..................... | G11C 13/004 |

(Continued)

FOREIGN PATENT DOCUMENTS

KR 10-0944322 3/2010

*Primary Examiner* — Viet Q Nguyen
(74) *Attorney, Agent, or Firm* — F. Chau & Associates, LLC

(57) ABSTRACT

A memory device and a method for operating the memory device are provided. A resistive memory cell connected to a first node and configured to include a variable resistive element and an access element for controlling a current flowing through the variable resistive element. A detection circuit detects a threshold voltage of the access element and provides a detection current to a sensing node. A clamping circuit connected between the first node and the sensing node receives a first read voltage and ramps up a voltage of the first node. The first node is discharged by a discharge circuit when the detection current becomes equal to a bit line current flowing through the first node while the clamping circuit ramps up the voltage of the first node. A sense amplifier transitions an output voltage value when a voltage level of the sensing node becomes lower than a reference voltage.

20 Claims, 15 Drawing Sheets

(56) References Cited

U.S. PATENT DOCUMENTS

| | | | |
|---|---|---|---|
| 9,478,285 B2 * | 10/2016 | Park | G11C 13/004 |
| 9,640,239 B2 * | 5/2017 | Piccardi | G11C 11/161 |
| 9,728,256 B2 * | 8/2017 | Di Vincenzo | G11C 13/0069 |
| 2002/0057604 A1 * | 5/2002 | Khouri | G11C 7/062 |
| | | | 365/200 |
| 2008/0158936 A1 * | 7/2008 | Bertin | B82Y 10/00 |
| | | | 365/148 |
| 2015/0221365 A1 * | 8/2015 | Park | G11C 13/004 |
| | | | 365/163 |
| 2016/0247562 A1 | 8/2016 | Tortorelli et al. | |
| 2016/0358648 A1 * | 12/2016 | Park | G11C 13/004 |

* cited by examiner

FIG. 2

| | 1_1 | 1_2 | 1_3 | 1_4 | 1_5 | 1_6 | 1_7 | 1_8 |
|---|---|---|---|---|---|---|---|---|
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | SA/WD(2_1) | | SA/WD(2_2) | | SA/WD(2_3) | | SA/WD(2_4) | |
| | PERIPHERY(3) | | | | | | | |
| | SA/WD(2_8) | | SA/WD(2_7) | | SA/WD(2_6) | | SA/WD(2_5) | |
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | 1_16 | 1_15 | 1_14 | 1_13 | 1_12 | 1_11 | 1_10 | 1_9 |

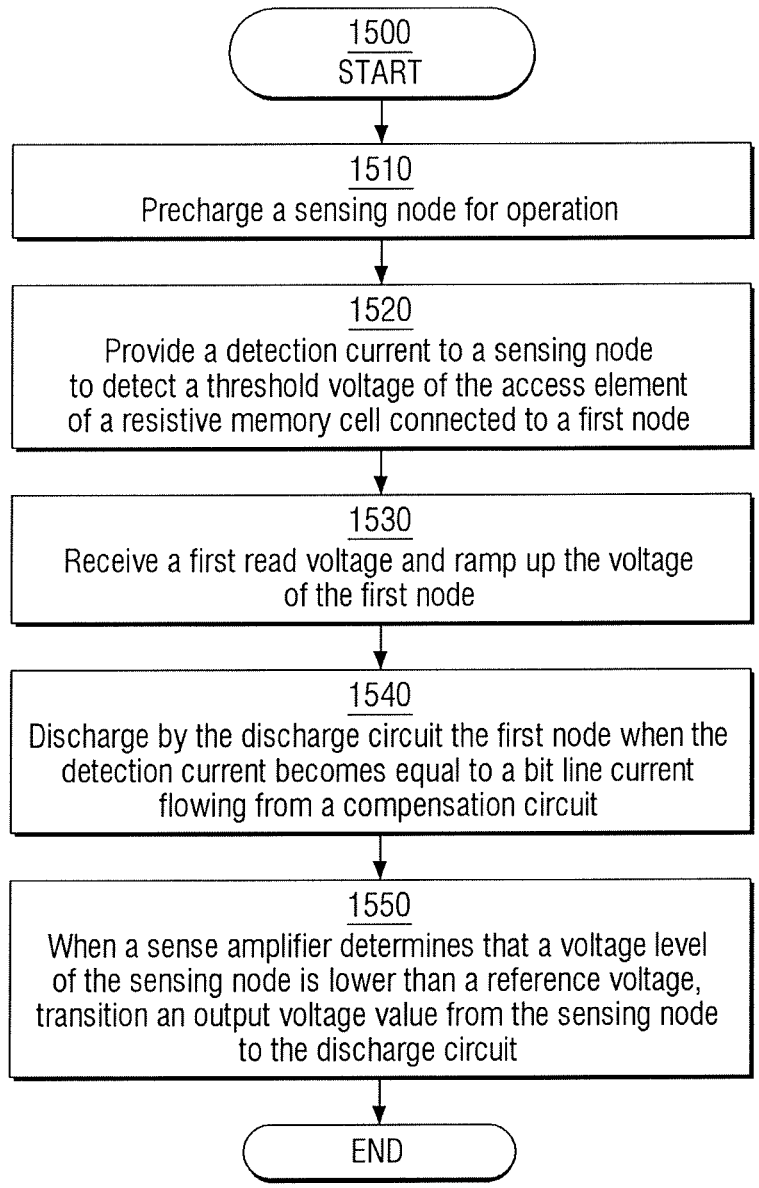

MEMORY DEVICE AND METHOD FOR OPERATING MEMORY DEVICE

CROSS-REFERENCE TO RELATED APPLICATION

This application claims priority from Korean Patent Application No. 10-2016-0169944 filed on Dec. 13, 2016 in the Korean Intellectual Property Office, and all the benefits accruing there from under 35 U.S.C. § 119, the contents of which are incorporated by reference herein.

1. Technical Field

The inventive concept relates to a memory device and a method for operating the memory device.

2. Discussion of the Related Art

A nonvolatile memory device of a type that utilizes a resistance material to store data includes a phase change random access memory (PRAM), a resistive random access memory (RRAM), a magnetic random access memory (MRAM), and the like. While a dynamic random access memory (DRAM) or a flash memory device stores data using charges, a nonvolatile memory device that uses a resistance material will store data by using, for example, a phase change of a phase change material such as a chalcogenide alloy (in the case of a PRAM), a resistance change of a variable resistance material (in the case of an RRAM), a resistance change of a magnetic tunnel junction (MTJ) thin film according to a magnetization state of a ferromagnetic material (in the case of an MRAM), and the like.

For example, in the case of a phase change memory cell, the phase change material is changed to a crystalline state or an amorphous state as it is cooled after being heated. In a crystalline state, the phase change material has a low resistance. In an amorphous state, the crystalline material has a high resistance. Accordingly, the crystalline state may be defined as set data or "0" data, and the amorphous state may be defined as reset data or "1" data.

In addition, an access element or a selector for controlling the phase change memory cell may be implemented as an ovonic threshold switch (OTS) type as well as a diode type and a transistor type. An access element that is used to control a memory cell may have a threshold voltage value for operation.

SUMMARY

The inventive concept includes a memory device capable of providing read reliability irrespective of a threshold voltage value of an access element.

The inventive concept also includes a method for operating a memory device capable of providing the read reliability irrespective of a threshold voltage value of an access element.

According to an embodiment of the inventive concept, a memory device includes a resistive memory cell connected to a first node, the resistive memory cell comprising a variable resistive element and an access element connected to the variable resistive element to control a current flow through the variable resistive element; a detection circuit is connected to a sensing node and configured to provide a detection current to the sensing node to detect a threshold voltage of the access element; a clamping circuit connected between the first node and the sensing node and configured to receive a first read voltage and ramp up a voltage of the first node; a discharge circuit connected to the first node and configured to discharge the first node when the detection current becomes equal to a bit line current flowing through the first node while the clamping circuit is configured to ramp up the voltage of the first node; and a sense amplifier configured to sense a voltage level of the sensing node and transition an output voltage value to the discharge circuit when the voltage level of the sensing node becomes lower than a reference voltage.

According to an embodiment of the inventive concept, there is provided a memory device including a resistive memory cell connected to a first node, the resistive memory cell including a variable resistive element and an access element connected to the variable resistive element to control a current flow through the variable resistive element; a detection circuit connected to a sensing node and configured to provide a detection current to the sensing node to detect a threshold voltage of the access element; a clamping circuit connected between the first node and the sensing node and configured to receive a first read voltage and ramp up a voltage of the first node; a sense amplifier configured to sense the sensing node and transition an output value when a voltage level of the sensing node becomes lower than a reference voltage; and an adjust circuit configured to receive the first read voltage and the output value of the sense amplifier and provide the first read voltage to the clamping circuit.

According to an embodiment of the inventive concept, an adjust circuit is configured to store a voltage level of the second read voltage, adjust the stored voltage level, and provide the adjusted second read voltage to the clamping circuit, and wherein a read operation is performed on the resistive memory cell based on the adjusted second read voltage. In addition, when the supply of the first read voltage to the clamping circuit is stopped, a second read voltage may be applied to the clamping circuit.

According to an embodiment of the inventive concept, there is provided a method for operating a memory device including providing a resistive memory cell connected to a first node and configured to include a variable resistive element and an access element for controlling a current flowing through the variable resistive element; providing a detection current to the sensing node to detect a threshold voltage of the access element; ramping up a voltage of the first node based on a first read voltage; sensing a voltage level of the sensing node and transitioning an output voltage value of a sense amplifier when the voltage level of the sensing node becomes lower than a reference voltage, while ramping up the voltage of the first node; and discharging the first node when the detection current becomes equal to a bit line current flowing through the first node.

According to an embodiment of the inventive concept, a first switch may be connected between an input terminal of the clamping circuit and an output terminal of a voltage source that outputs the first read voltage, wherein the first switch in an open state stops a supply of the first read voltage to the clamping circuit. In addition, the first switch may comprises a voltage controlled switch that in an open state stops the supply of the first read voltage to the clamping circuit, and in a closed state provides a path for supply of the first read voltage to the clamping circuit, the first switch being controlled according to the output voltage value of the sense amplifier.

According to an embodiment of the inventive concept, the memory device comprises a memory cell array including a plurality of memory banks, each of the memory banks includes a plurality of memory blocks each having arranged in matrix form one nonvolatile resistive memory cell, and the memory cell array includes a peripheral circuit region.

According to an embodiment of the inventive concept, the access element may comprises an ovonic threshold switch (OTS) connected in series with the variable resistive element, and a voltage across the resistive memory cell is adjusted by the clamping circuit to prevent a program operation while the OTS is being turned on for a read operation. In the case of the access element being an OTS, the threshold voltage of the access element is about 2.85 volts.

According to an embodiment of the inventive concept, when the access element comprises a diode, the threshold voltage is about 1 volt.

BRIEF DESCRIPTION OF THE DRAWINGS

A person of ordinary skill in the art should understand and appreciate that the inventive concept is not limited to the description and drawings set forth herein. The inventive concept will be appreciated by a person of ordinary skill in the art to which the present disclosure pertains by referencing the detailed description and drawings provided herein. The inventive concept is explained in more detail herein below in exemplary embodiments with reference to the attached drawings, in which:

FIG. 2 is a block diagram illustrating a memory device according to some embodiments of the inventive concept;

FIG. 15 is a flowchart illustrating an operation a memory device according to the inventive concept.

DETAILED DESCRIPTION

Figure 1:
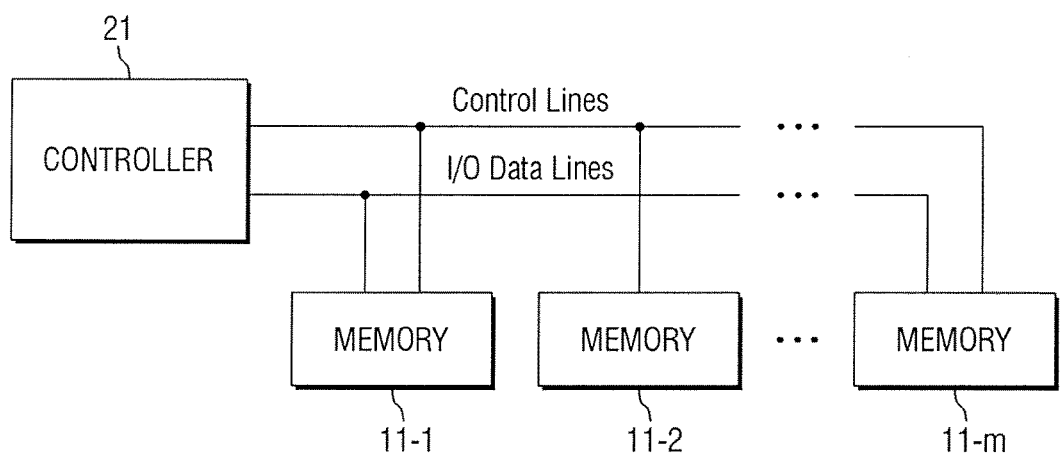
FIG. 1 is a block diagram illustrating a memory system according to some embodiments of the inventive concept.

FIG. 1 is a block diagram illustrating a memory system according to some embodiments of the inventive concept.

Referring to FIG. 1, a memory system according to some embodiments of the inventive concept may include a plurality of memory devices 11_1, 11_2 to 11_*m* (m is a natural number) and a controller 21.

The plurality of memory devices 11_1 to 11_*m* and the controller 21 are connected to each other via control lines and input/output (I/O) data lines. For example, the controller 21 may provide various commands (e.g., a write command, a read command, etc.) to the plurality of memory devices 11_1 to 11_*m* through the control lines. The controller 21 may receive requests to read or write data in the memory device from an external device or host. In addition, the controller 21 may exchange data with the plurality of memory devices 11_1 to 11_*m* through the I/O data lines. For example, the data associated with a write command may be provided to a particular one or more of the memory devices 11_1 to 11_*m* via the I/O data lines.

Although it is illustrated in the drawings that the plurality of memory devices 11_1 to 11_*m* share the control lines and the I/O data lines, the inventive concept is not limited thereto. For example, the plurality of memory devices 11_1 to 11_*m* may share only the I/O data lines, and may not share the control lines. Other arrangements are also within the inventive concept.

Meanwhile, the plurality of memory devices 11_1 to 11_*m* may include various kinds of memories. For example, the plurality of memory devices 11_1 through 11_*m* may include volatile memory devices (such as DRAM), and nonvolatile memory devices (such as NAND flash and NOR flash). Further, the plurality of memory devices 11_1 to 11_*m* may include nonvolatile memory devices (i.e., resistive memory devices) using a resistance material, such as PRAM, RRAM and MRAM.

FIG. 2 is a block diagram illustrating an example of a memory device according to some embodiments of the inventive concept. A person of ordinary skill in the art should understand that the inventive concept is not limited to an arrangement of the memory device shown in FIG. 2, which has been provided for ease of illustration. Referring to FIG. 2, a nonvolatile memory device according to embodiments of the inventive concept includes a memory cell array, a plurality of sense amplifiers (SA) and write drivers (WD) 2_1 to 2_8, and a peripheral circuit region 3 (e.g. periphery).

The memory cell array may include a plurality of memory banks 1_1 to 1_16 and each of the memory banks 1_1 to 1_16 may include, for example, a plurality of memory blocks BLK0 to BLK7. Each of the memory blocks BLK0 to BLK7 includes a plurality of nonvolatile memory cells arranged in a matrix form. In the embodiments of the inventive concept, a case where eight memory blocks are arranged in each memory bank has been illustrated as an example, but the inventive concept is not limited to having eight memory blocks in each memory bank.

Although not shown in detail in the drawings, a row selecting circuit and a column selecting circuit for designating rows and columns of resistive memory cells, to/from which data are to be written/read, corresponding to the memory banks 1_1 to 1_16, respectively, may be arranged within the memory device.

Each of the sense amplifiers SA and each of the write drivers WD 2_1 to 2_8 are arranged to correspond to two memory banks of the memory banks 1_1 to 1_16 to perform read and write operations in the corresponding two memory banks. In the embodiments of the inventive concept, in a case where each of the sense amplifiers SA and each of the write drivers WD 2_1 to 2_8 are arranged to correspond to two memory banks of the plurality of memory banks 1_1 to 1_16 has been illustrated as an example. However, the inventive concept is not limited to the structural arrangement shown in FIG. 2. For example, each of the sense amplifiers SA and each of the write drivers WD 2_1 to 2_8 may be arranged to correspond to one memory bank, or four memory banks, or N memory banks.

In the peripheral circuit region 3 ("periphery" in FIG. 2), a plurality of logic circuit blocks and a voltage generating circuit for operating the column selecting circuit, the row selecting circuit, the sense amplifiers and the write drivers 2_1 to 2_8, and the like may be disposed.

Figure 3A:
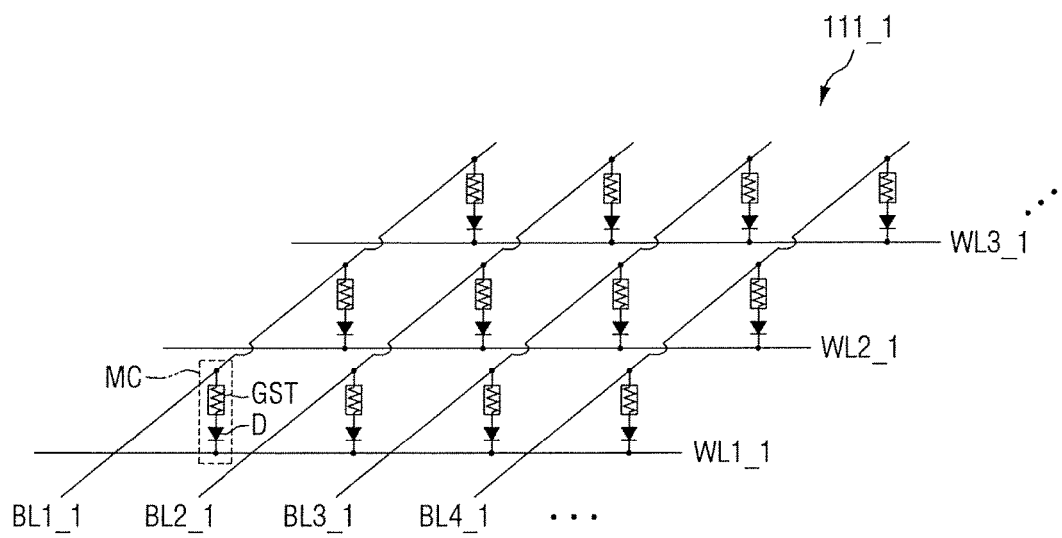
FIGS. 3A, 3B and 4 provide different views of a memory cell array shown FIG. 2.
Figure 3B:
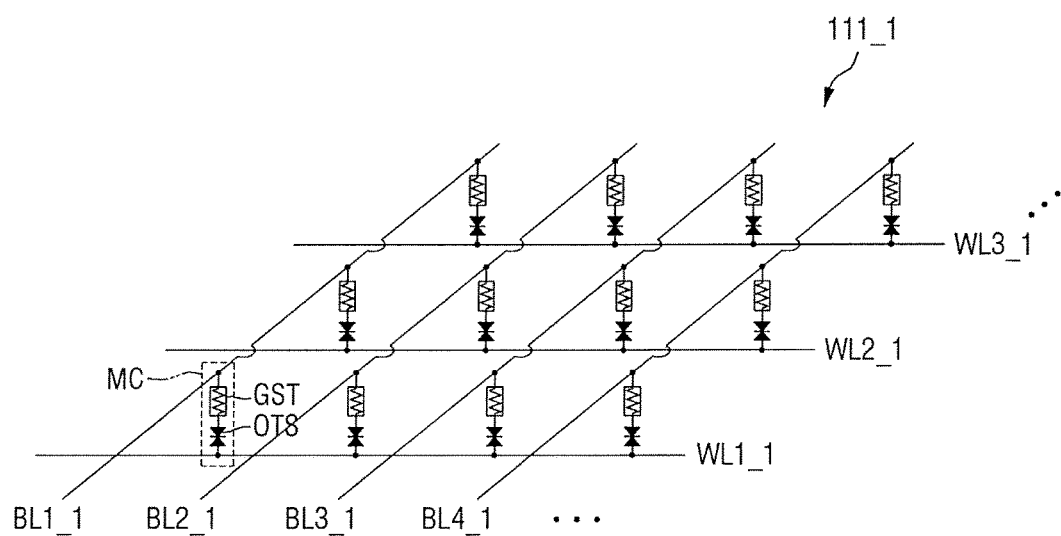
Figure 4:
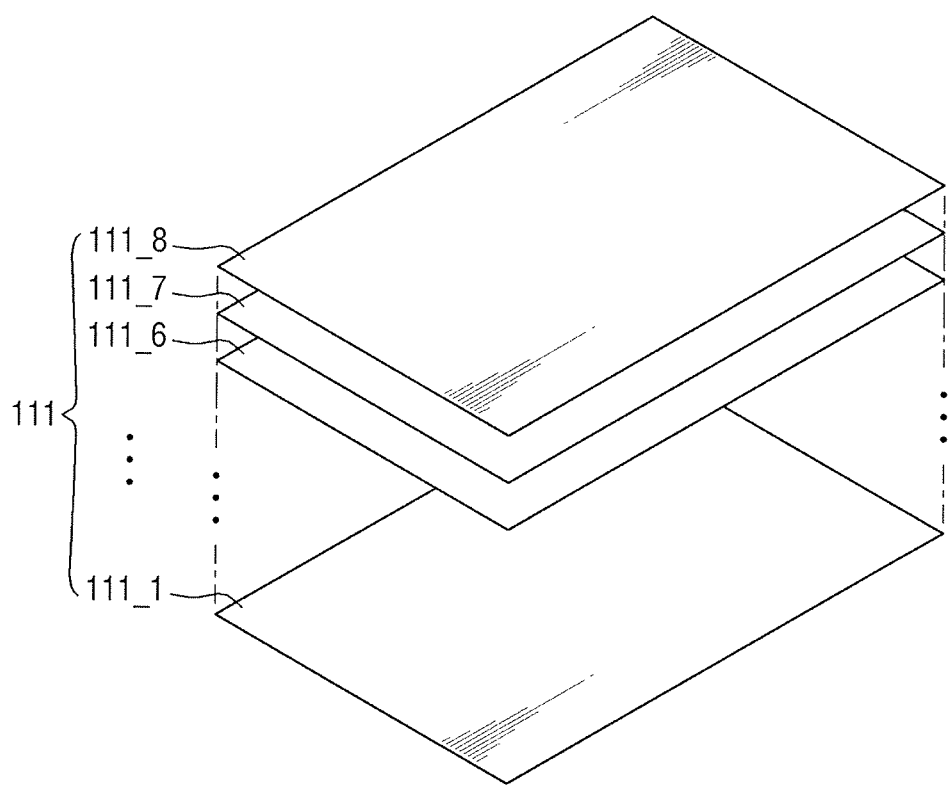

FIGS. 3A, 3B and 4 are multiple views of the memory cell array of FIG. 2.

Referring to FIGS. 3A and 3B, the memory cell array may be arranged to have a cross point structure. The cross point structure refers to a structure in which one memory cell is formed in an area where one line and another line cross each other. For example, bit lines BL1_1 to BL4_1 may be formed to extend in a first direction and word lines WL1_1 to WL3_1 may be formed to extend in a second direction so as to intersect the bit lines BL1_1 to BL4_1.

A resistive memory cell MC may be formed in a region where each of the bit lines BL1_1 to BL4_1 and each of the word lines WL1_1 to WL3_1 intersect each other. As can be seen in FIGS. 3A and 3B, a resistive memory cell may be connected to one bit line and to one word line.

For example, in a case where the resistive memory cell MC is a PRAM, the resistive memory cell MC may include a variable resistive element GST (e.g. $Ge_2Sb_2Te_2$) including a phase change material, and an access element for controlling the current flowing through the variable resistive element GST.

With reference to FIG. 3A, the access element used to control the current flowing through the variable resistive element GST may be a diode D (shown in FIG. 3A), or a transistor (not shown) connected in series with the variable resistive element GST. With reference to FIG. 3B, the access element may be an ovonic threshold switch (OTS) connected in series with the variable resistive element GST.

The variable resistive element may be constructed of a phase change material, selected from various materials. For example, the variable resistive element may be comprised of germanium (Ge), antimony (Sb) and tellurium (Te). Moreover the variable resistive element may be comprised of a combination of two elements, such as GaSb, InSb, InSe, Sb2Te3 and GeTe, a combination of three elements, such as GeSbTe, GaSeTe, InSbTe, SnSb2Te4 and InSbGe, or a combination of four elements such as AgInSbTe, (GeSn)SbTe, GeSb(SeTe) and Te81Ge15Sb2S2 may be used.

With regard to a case where the resistive memory cell is an RRAM, the variable resistive element GST may include, for example, NiO or perovskite. The perovskite may be a composition of manganite (such as $Pr_{0.7}Ca_{0.3}MnO_3$, $Pr_{0.5}Ca_{0.5}MnO_3$, PCMO, and LCMO), titanate (such as STO:Cr), zirconate (such as SZO:Cr, $Ca_2Nb_2O_7$:Cr, and $Ta_2O_5$:Cr) and the like. A filament may be formed in the variable resistive element and becomes a current path of the cell current flowing through the resistive memory cell.

The memory cell array may have a three-dimensional stack structure as shown in FIG. 4. The three-dimensional stack structure refers to a structure in which a plurality of memory cell layers 111_1 to 111_8 are vertically stacked. In FIG. 4, a case where eight memory cell layers 111_1 to 111_8 are stacked has been illustrated, but the inventive concept is not limited thereto. Here, each of the memory cell layers 111_1 to 111_8 may include a plurality of memory cell groups and/or a plurality of redundancy memory cell groups. When the memory cell array has a three-dimensional stacked structure, each of the memory cell layers 111_1 to 111_8 may have a cross-point structure shown in FIGS. 3A and 3B, but the inventive concept is not limited thereto.

Figure 5:
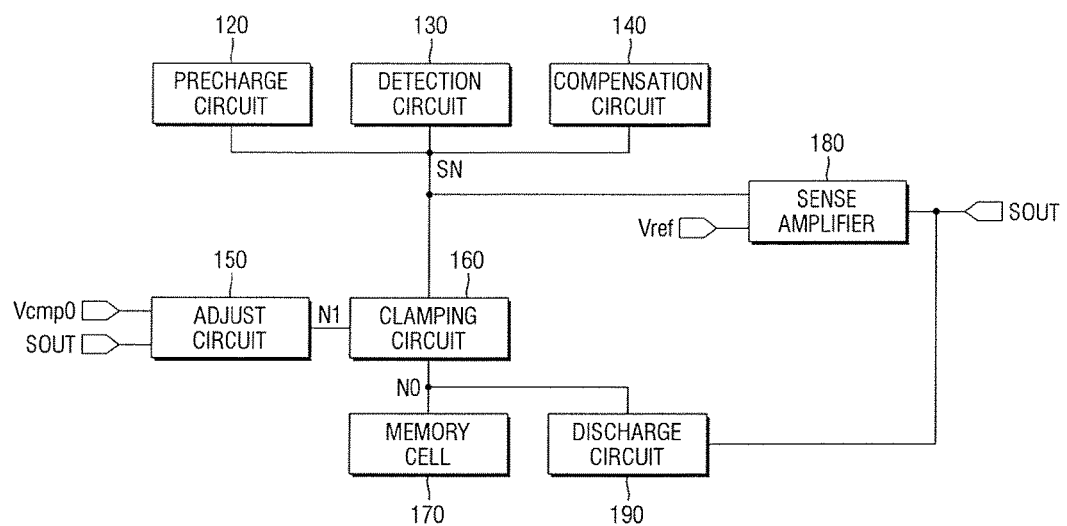
FIG. 5 is a block diagram illustrating a memory device according to an embodiment of the inventive concept.

FIG. 5 is a block diagram illustrating a memory device according to an embodiment of the inventive concept.

Figure 6:
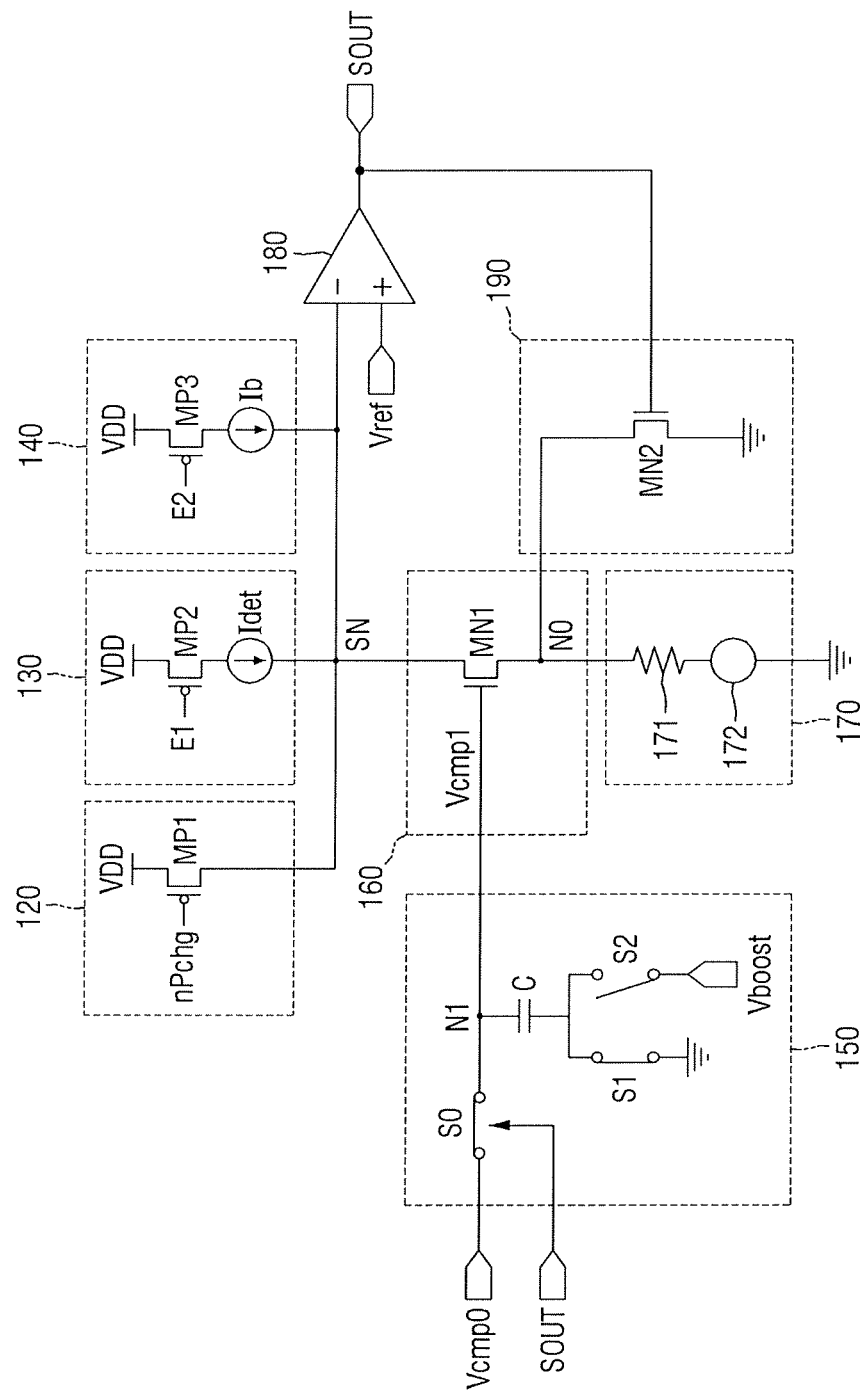
FIGS. 6, 7 and 8 are circuit diagrams that illustrate a memory device according to an embodiment of the inventive concept.
Figure 7:
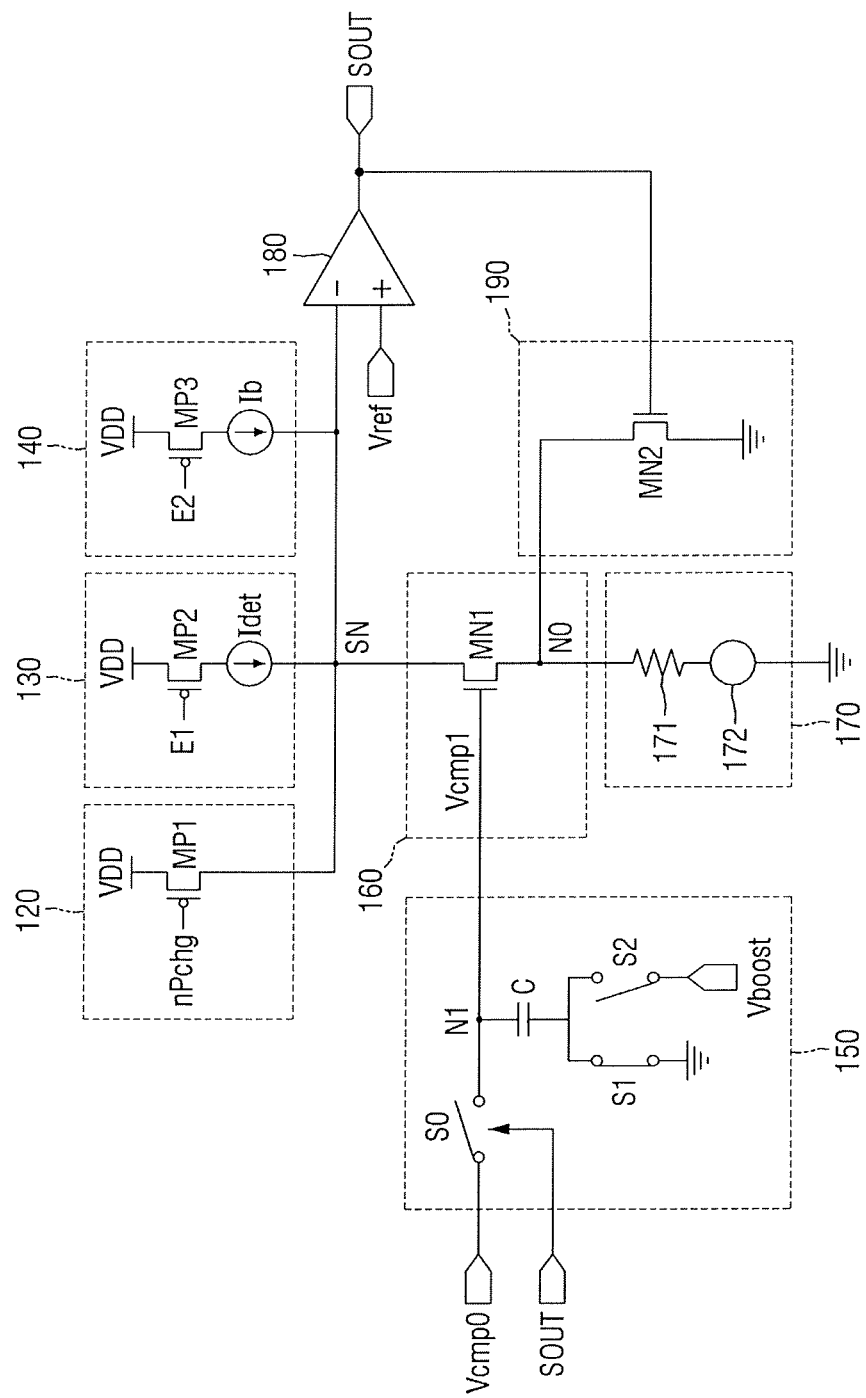
Figure 8:
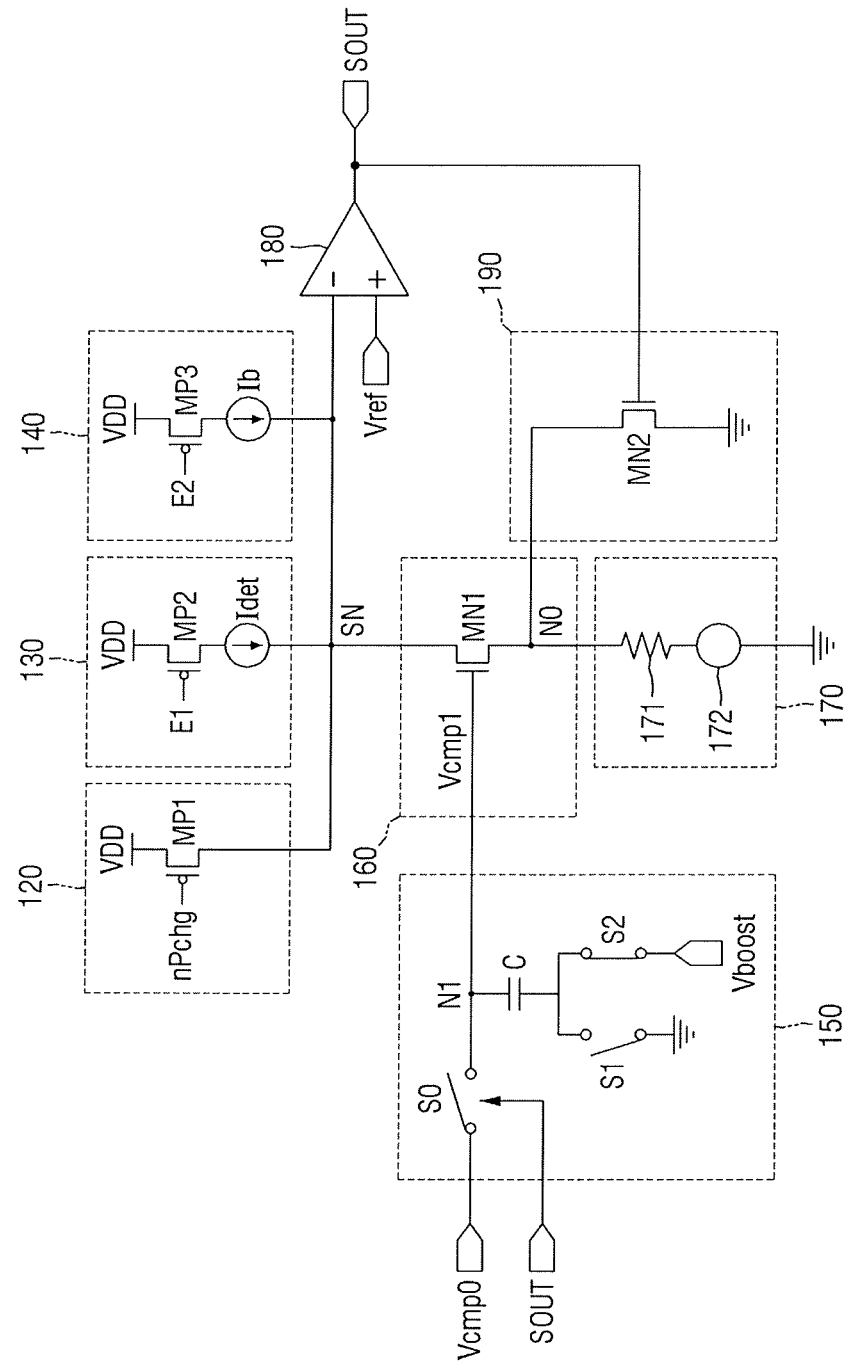

Referring to FIG. 5, a memory device according to an embodiment of the inventive concept includes a precharge circuit 120, a detection circuit 130, a compensation circuit 140, an adjust circuit 150, a clamping circuit 160, a resistive memory cell 170, a sense amplifier 180, and a discharge circuit 190. One example of the structure of the aforementioned circuits is shown in FIGS. 6, 7 and 8.

The precharge circuit 120 is connected to a sensing node SN to precharge the sensing node SN to a predetermined voltage threshold. For example, the precharge circuit 120 may provide a power supply voltage VDD to the sensing node SN before performing a read operation on the resistive memory cell 170.

With continued reference to FIG. 5, the detection circuit 130 is connected to the sensing node SN and provides a detection current Idet for detecting a threshold voltage Vth of an access element 172 provided in the resistive memory cell 170 to the sensing node SN. As described above with reference to FIGS. 3A and 3B, the access element 172 may be comprised of, for example, a diode D connected in series with the variable resistive element GST or may be an OTS connected in series with the variable resistive element GST.

For example, when the access element 172 is implemented as a diode D, such as shown in FIG. 3A, the threshold voltage Vth of the diode D is about 1.0 V. However, when the access element 172 is implemented as an OTS, the threshold voltage Vth of the OTS corresponds to about 2.85 V. In addition, the width of the scatter of the data stored in the resistive memory cell 170 increases when the access element 172 is implemented as an OTS.

Thus, the effective window size that can ensure the reliability of the read operation, for example, between first data S and second data R stored in the resistive memory cell 170 is reduced, and even the scatter of the first data S and the scatter of the second data R may overlap each other.

Therefore, when the access element 172 is implemented as an OTS, the potential difference across the resistive memory cell 170 may be adjusted to prevent a program (PGM) operation due to a melting of the phase change material such as the variable resistive element GST while the OTS can be turned on to ensure the reliability of the read operation. In view of the threshold voltage Vth of the OTS corresponding to about 2.85V, the adjustment of the potential difference across the resistive memory cell 170 can be performed.

In some embodiments of the inventive concept, the detection current Idet provided by the detection circuit 130 may correspond to a minimum current for turning on the OTS. Alternatively, the detection current Idet provided by the detection circuit 130 may be set to an appropriate specific value that exceeds a minimum current for turning on the OTS.

The compensation circuit 140 provides a compensation current Ib to the sensing node SN. After a second read voltage Vcmp1 suitable for reading the resistive memory cell 170 is determined, the compensation current Ib may be used to read data stored in the resistive memory cell 170 using the second read voltage Vcmp1.

With continued reference to FIG. 5, the adjust circuit 150 stores a voltage level of the second read voltage Vcmp1, adjusts the stored voltage level, and provides the adjusted second read voltage Vcmp1 to the clamping circuit 160.

The clamping circuit 160 is connected between a first node N0 and the sensing node SN, receives a first read voltage Vcmp0, and ramps up the voltage of the first node N0.

The sense amplifier 180 senses the sensing node SN and transitions an output value SOUT when the voltage level of SN becomes lower than a reference voltage Vref. For example, the sense amplifier performs a comparing of the voltage level of SN with Vref.

The discharge circuit 190 is connected to the first node N0. While the clamping circuit 160 ramps up the voltage of the first node N0, when the detection current Idet becomes equal to a bit line current Ib1 flowing through the first node N0, the discharge circuit 190 discharges the first node N0.

FIGS. 6 to 8 are circuit diagrams illustrating a memory device according to an embodiment of the inventive concept.

Referring to FIG. 6, the precharge circuit 120 may be implemented using a P-type transistor MP1 which is gated by an nPchg signal. However, the scope of the inventive concept is not limited thereto, and it may be implemented in various ways, for example, with different types of components.

The detection circuit 130 may be implemented using a current source Idet and a P-type transistor MP2 which is gated by an E1 signal. However, the scope of the inventive concept is not limited thereto, and the detection circuit may be implemented in various ways other than shown in FIG. 6.

The compensation circuit 140 may be implemented using a current source Ib and a P-type transistor MP3 which is gated by an E2 signal. However, the scope of the inventive concept is not limited thereto, and it may be implemented in various ways other than shown in FIG. 6.

The adjust circuit 150 may include a first switch S0 that in a first state may stop/interrupt the supply of the first read voltage Vcmp0 to the clamping circuit 160 according to the output value SOUT of the sense amplifier. Further, the adjust circuit 150 may include a capacitor C having a first electrode connected to a second node N1, the capacitor can store the voltage level of the first read voltage Vcmp0 when the first switch S0 is closed. Further, the adjust circuit 150 may include one or more switches S1 and S2 that are connectable to the capacitor C to adjust the voltage level of the first read voltage Vcmp0.

The clamping circuit 160 may include an N-type transistor MN1 which is gated by the second read voltage Vcmp1.

The resistive memory cell 170 includes, as described above, a variable resistive element 171 and an access element 172 for controlling the current flowing through the variable resistive element 171, and the resistive memory cell 170 is connected to the first node N0.

The discharge circuit 190 may include an N-type transistor MN2 which is gated by the output value SOUT of the sense amplifier 180. However, the scope of the inventive concept is not limited thereto, and it may be implemented in various ways.

Referring to FIG. 6, a state is shown where the first switch S0 and a second switch S1 are closed, and a third switch S2 is opened. In this case, the clamping circuit 160 ramps up (e.g. linearly increases) the voltage of the first node N0 using the first read voltage Vcmp0 that gates the transistor MN1.

Referring to FIG. 7, a state is shown where the second switch S1 is closed, and the first switch S0 and the third switch S2 are opened. For example, when the second read voltage Vcmp1 for performing the read operation on the resistive memory cell 170 is determined, the clamping circuit 160 no longer receives the first read voltage Vcmp0. The adjust circuit 150 maintains the determined second read voltage Vcmp1 by using, for example, a capacitor C or the like. For example, the capacitor C may discharge, and the discharge may, for a period of time, maintain the voltage provided to Vcmp1.

Referring now to FIG. 8, another state is shown where the first switch S0 is opened, and the second switch S1 and the third switch S2 may be opened or closed as determined to change a level of the second read voltage. For example, the third switch S2 may be closed to positively boost the second read voltage Vcmp1 determined in FIG. 7. Alternatively, the third switch S2 may be opened to negatively boost the second read voltage Vcmp1.

Thereafter, the memory device according to the embodiment of the inventive concept may perform the read operation on the resistive memory cell 170 based on the adjusted second read voltage Vcmp1.

Figure 9:
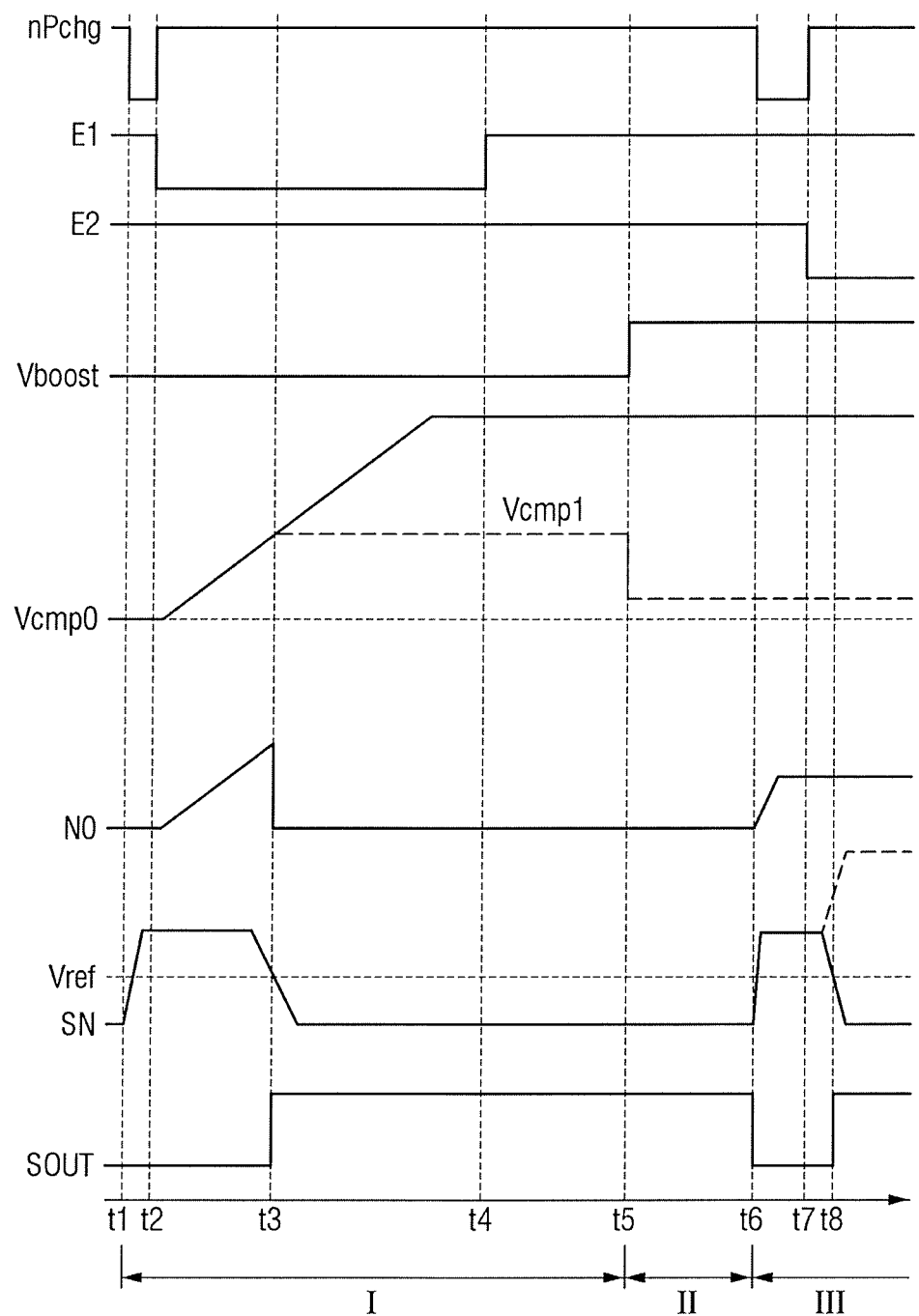
FIGS. 9 and 10 are timing charts that illustrate a method of operating a memory device according to an embodiment of the inventive concept.
Figure 10:
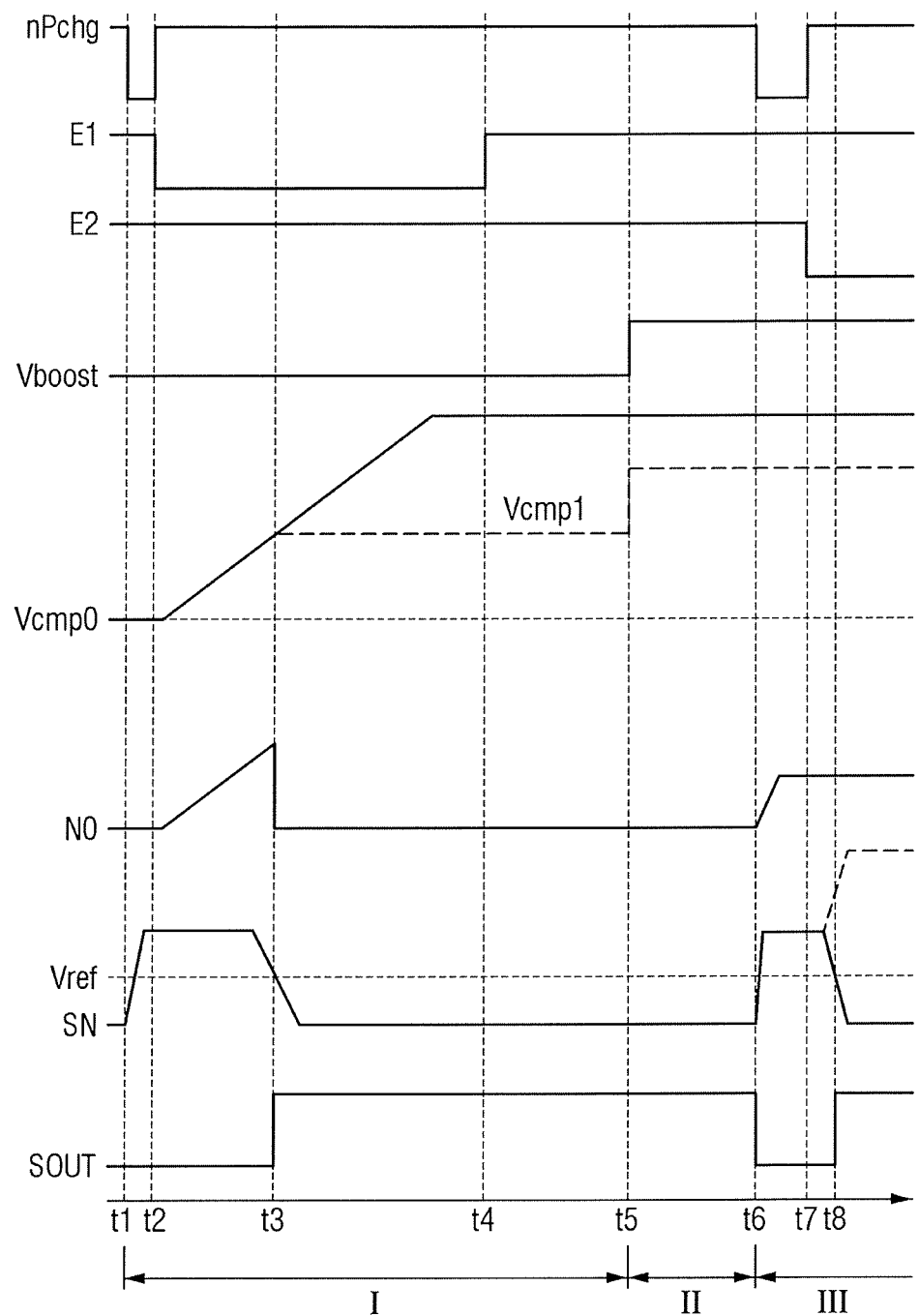

FIGS. 9 and 10 are timing charts illustrating a method of operating a memory device according to an embodiment of the inventive concept.

Referring to FIGS. 9 and 10, a method of operating a memory device according to an embodiment of the inventive concept may be largely divided for explanatory purposes into a first section I from a time point t1 to a time point t5, a second section II from the time point t5 to a time point t6, and a third section III after the time point t6.

Referring to FIG. 9, the first section I is a section for determining the second read voltage Vcmp1 for ensuring the read reliability.

More specifically, the sensing node SN (shown in FIGS. 6 through 8) is precharged according to the nPchg signal from the time point t1 (FIG. 9) to the time point t2. Accordingly, the voltage level of the sensing node SN rises above the voltage level of the reference voltage Vref. Sense amplifier 180 (e.g. comparator shown in FIG. 8), has one logic output (e.g. low) when a voltage value of the sensing node SN is higher than Vref, and another logic output (e.g. high), when a voltage value of the sensing node SN is lower than Vref.

The precharge (nPchg) is terminated at the time point t2 and the detection current Idet for detecting the threshold voltage Vth of the access element 172 provided in the resistive memory cell 170 at the time point t2 to the time point t4 is provided to the sensing node SN. Then, the clamping circuit 160 ramps up the voltage of the first node N0. More specifically, the first node N0 also ramps up while the first read voltage Vcmp0 ramps up. At this time, the bit line current Ib1 flowing through the first node N0 also increases.

The time point t3 indicates a time point when the detection current Idet (see detection circuit 130 in FIG. 8) and the bit line current Ib1 (see compensation circuit 140 in FIG. 8) flowing through the first node N0 become equal to each other. At this moment, the second read voltage Vcmp1 (FIG. 9) for performing the read operation on the resistive memory cell 170 is determined.

The sense amplifier 180 transitions the output value SOUT from a low level to a high level at the time point t3, which means that the second read voltage Vcmp1 has been determined. The output value SOUT transitioned at the time t3 can control the first switch S0 to stop/interrupt the supply of the first read voltage Vcmp0 to the clamping circuit 160.

When the detection current Idet and the bit line current Ib1 flowing through the first node N0 become equal to each other, the discharge circuit 190 discharges a voltage level of the first node N0 to reduce power consumption.

Next, the second section II of the timing chart is a section for adjusting the determined second read voltage Vcmp1.

As described above, the second read voltage Vcmp1 may be boosted positively or negatively. FIG. 9 shows a case where the second read voltage Vcmp1 is boosted negatively (e.g. decreased), and FIG. 10 shows a case where the second read voltage Vcmp1 is boosted positively (e.g. increased).

Next, the third section III of the timing chart is a section for performing the read operation on the resistive memory cell 170 based on the adjusted second read voltage Vcmp1.

The reading of the data stored in the resistive memory cell 170 in the third section III may be implemented by a conventional method in the art, however, the read voltage serving as a basis for the reading of the data is determined in the first section I to the second section II of the timing charts according to the inventive concept. Accordingly, a detailed description of the third section III thereof will be omitted herein.

Figure 11:
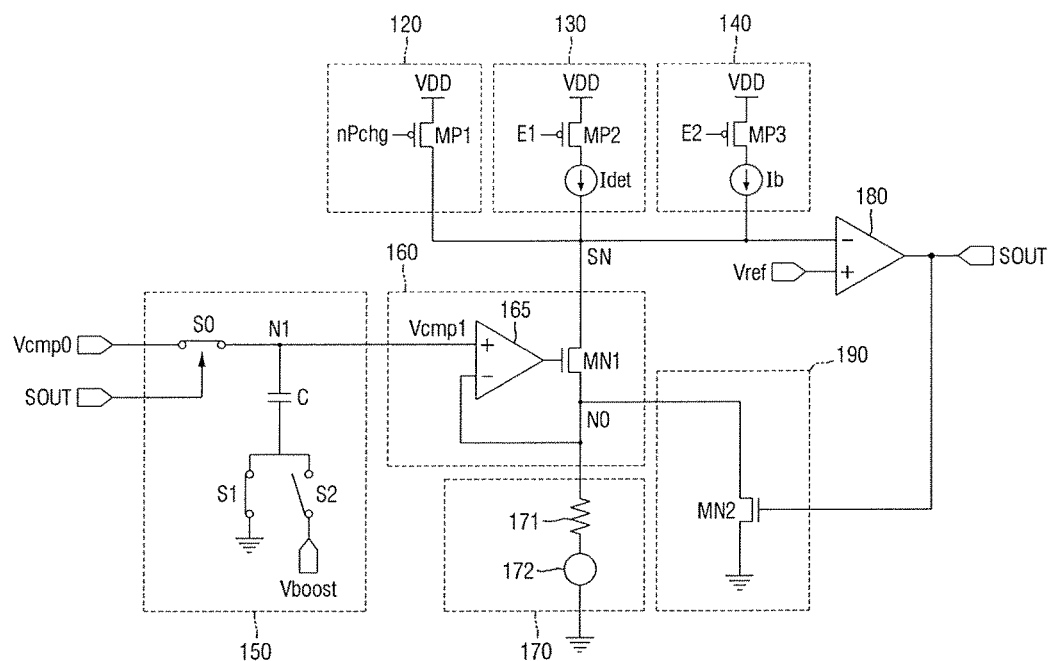
FIGS. 11 to 13 are circuit diagrams that illustrate a memory device according to another embodiment of the inventive concept.
Figure 12:
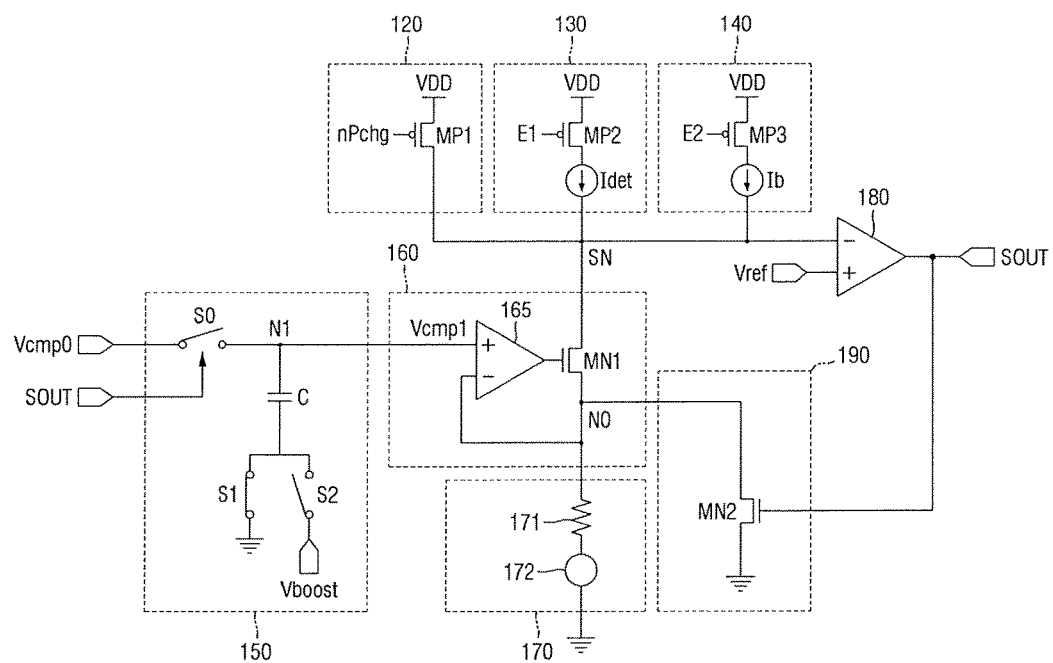
Figure 13:
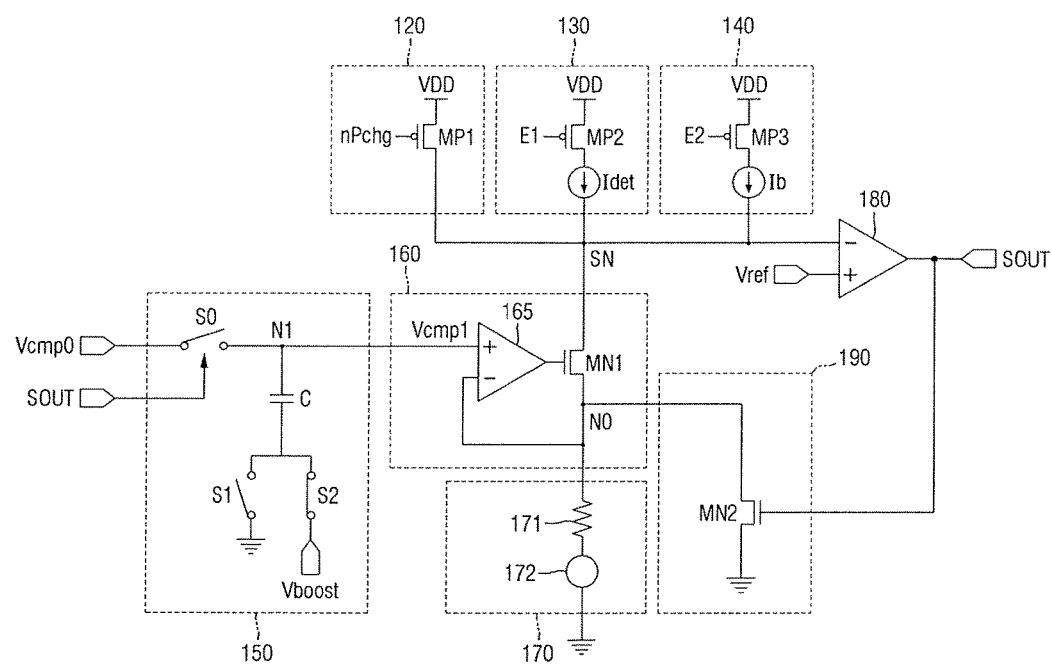

FIGS. 11 to 13 are circuit diagrams illustrating operation of a memory device according to an embodiment of the inventive concept.

The circuit diagrams shown in FIGS. 11 to 13 differ from the circuit diagrams of FIGS. 6 to 8 at least with regard to the clamping circuit 160 further including a comparator that gates the transistor MN1 based on the comparison result of the voltage level of the first node N0 with Vcomp1. The feedback comparator 165, shown in the clamping circuit 160, receives, as a feedback, a voltage having the voltage level of the first node N0. By implementing the clamping circuit 160 using the feedback comparator 165, a more stable voltage can be maintained at the first node N0.

Referring to FIG. 11, the first switch S0 and the second switch S1 are closed, and the third switch S2 is opened. At this time, the clamping circuit 160 ramps up the voltage of the first node N0 using the first read voltage Vcmp0.

Referring to FIG. 12, the second switch S1 is closed, and the first switch S0 and the third switch S2 are opened. For example, when the second read voltage Vcmp1 for performing the read operation on the resistive memory cell 170 is determined, the clamping circuit 160 no longer receives the first read voltage Vcmp0. The adjust circuit 150 maintains the determined second read voltage Vcmp1 by using, for example, a capacitor C or the like.

Referring to FIG. 13, the first switch S0 is opened, and the second switch S1 and the third switch S2 may be opened or closed as desired. For example, the third switch S2 may be closed to positively boost the second read voltage Vcmp1 determined in FIG. 7. Alternatively, the third switch S2 may be opened to negatively boost the second read voltage Vcmp1.

Thereafter, the memory device according to the embodiment of the inventive concept may perform the read operation on the resistive memory cell 170 based on the adjusted second read voltage Vcmp1.

Figure 14:
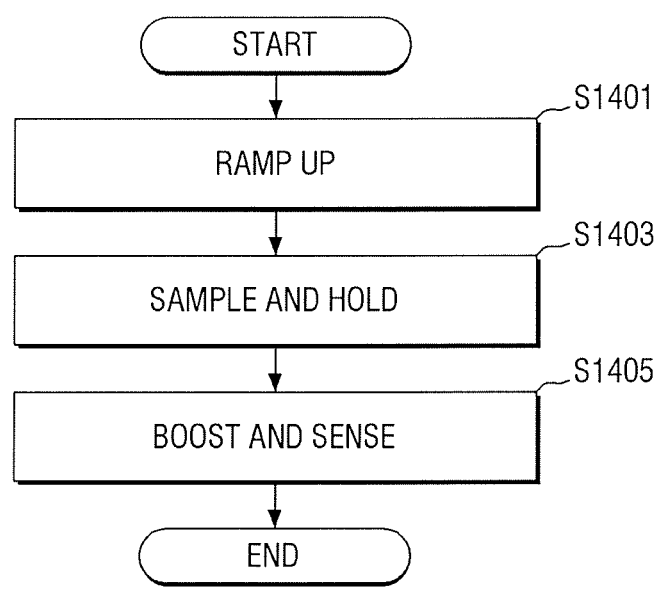
FIG. 14 is a flowchart illustrating a method of operating a memory device according to an embodiment of the inventive concept.

FIG. 14 is a flowchart illustrating a method of operating a memory device according to an embodiment of the inventive concept.

Referring to FIG. 14, a method of operating a memory device according to an embodiment of the inventive concept comprises, at operation (S1401), ramping up the voltage of the first node N0 by using the clamping circuit 160. At this time, the first switch S0 and the second switch S1 may be closed, and the third switch S2 may be opened.

At operation (S1403), the method may comprise sampling an appropriate read voltage Vcmp1 and holding the value thereof. At this time, the second switch S1 may be closed and the first switch S0 and the third switch S2 may be opened. The value may be maintained (e.g. held) by a capacitor C such as shown in FIG. 12.

At operation (S1405), the method may comprise performing the read operation on the resistive memory cell 170 after adjusting the read voltage Vcmp1. At this time, the first switch S0 may be opened, and the second switch S1 and the third switch S2 may be opened or closed as determined to negatively boost or positively boost the voltage.

Specifically, the method may comprise providing the resistive memory cell 170 connected to the first node N0 and including the variable resistive element 171 and the access element 172 for controlling the current flowing through the variable resistive element 171. Then, the detection current Idet may be provided to the sensing node SN to detect the threshold voltage Vth of the access element 172, and the voltage of the first node N0 may be ramped up based on the first read voltage Vcmp0.

Then, the method may comprise sensing the sensing node SN while the clamping circuit 160 ramps up the voltage of the first node N0, transitioning the output value SOUT if the voltage level becomes lower than the reference voltage Vref, and discharging the first node N0 if the detection current Idet and the bit line current Ib1 flowing through the first node N0 become equal to each other.

FIG. 15 is a flowchart illustrating an operation a memory device according to the inventive concept. FIGS. 5 and 6 provide one example of the structure that may perform the operation of the memory device according to the inventive concept.

At operation 1510, a sensing node SN is precharged for operation. For example, the precharge circuit 120, which may be embodied by a transistor, is controlled by a gate signal nPchg (in the case where the transistor is a P-type transistor such as shown in FIG. 6).

At operation 1520, a detection circuit 130 may provide a detection current to the sensing node to detect a threshold voltage of the access element 172 of the resistive memory cell connected to a first node. As previously discussed, if the access element 172 is a diode, the threshold voltage is about 1V. However, if the access element is an Ovonic Threshold Switch (OTS) connected to the variable resistive element 171, the threshold voltage is about 2.85 volts.

At operation 1530, a first read voltage (Vcmp0) is received by a clamping circuit 160. The clamping circuit 160 in response will ramp up a voltage of the first node N0. While the voltage of the first node N0 is being ramped up by the clamping circuit 160, a detection current Idet from the detection circuit 130 becomes equal to a bit line current flowing from the compensation circuit 140.

At operation 1540, when the detection current becomes equal to the bit line current, the discharge circuit 190 discharges first node. The discharge circuit 190 discharges a voltage level of the first node No to reduce power consumption.

At operation 1550, the sense amplifier 180, which has an output SOUT used to control the gate of the discharge circuit 190, compares the voltage level of the sensing node SN with a reference voltage, and transitions an output voltage value SOUT when the voltage value of the sensing node becomes lower than a reference voltage. As previously discussed, the sense amplifier 180 may transition the output value when a second read voltage Vcmp1 has been determined. Accordingly, the memory device can provide read reliability irrespective of a threshold voltage value of an access element.

In some embodiments of the inventive concept, discharging the first node N0 may comprise discharging the first node N0 according to the output value SOUT of the sense amplifier 180.

In some embodiments of the inventive concept, ramping up the first node N0 may comprise ramping up the voltage of the first node N0 based on the second read voltage Vcmp1 instead of the first read voltage Vcmp0 according to the output value SOUT of the sense amplifier 180.

In some embodiments of the inventive concept, the method may further comprise storing the voltage level of the second read voltage Vcmp1, and ramping up the first node N0 may comprise ramping up the voltage of the first node N0 based on the adjusted second read voltage Vcmp1.

In some embodiments of the inventive concept, the method may further comprise precharging the sensing node SN. Further, in some embodiments of the inventive concept, the method may further comprise providing the compensation current Ib to the sensing node SN.

According to various embodiments of the inventive concept described above, since the variable resistive element 171 and the access element 172 can be sensed respectively, a sensing margin can be ensured even when the effective window size is not secured. Therefore, even when the access element 172 having a large threshold voltage Vth is implemented as an OTS, the reliability of the read operation can be ensured regardless of the scatter of the data stored in the resistive memory cell 170.

The term "unit" as may be referred to herein is to be understood as including hardware components arranged in a circuit or an integrated circuit and may include software.

Although the preferred embodiments of the inventive concept have been disclosed for illustrative purposes, those skilled in the art will appreciate that various modifications, additions and substitutions are possible, without departing from the scope and spirit of the disclosure as disclosed in the accompanying claims.

What is claimed is:

1. A memory device comprising:
    a resistive memory cell connected to a first node, the resistive memory cell including a variable resistive element and an access element connected to the variable resistive element to control a current flow through the variable resistive element;
    a detection circuit connected to a sensing node and configured to provide a detection current to the sensing node to detect a threshold voltage of the access element;
    a clamping circuit connected between the first node and the sensing node and configured to receive a first read voltage and to ramp up a voltage of the first node;
    a discharge circuit connected to the first node and configured to discharge the first node when the detection current becomes equal to a bit line current flowing through the first node while the clamping circuit ramps up the voltage of the first node; and
    a sense amplifier configured to sense a voltage level of the sensing node and transition an output voltage value to the discharge circuit when the voltage level of the sensing node becomes lower than a reference voltage.

2. The memory device of claim 1, wherein the discharge circuit comprises a transistor which is gated by the output voltage value of the sense amplifier.

3. The memory device of claim 1, further comprising a first switch connected between an input terminal of the clamping circuit and an output terminal of a voltage source that outputs the first read voltage, wherein the first switch in an open state stops a supply of the first read voltage to the clamping circuit.

4. The memory device of claim 3, wherein the first switch comprises a voltage controlled switch that in an open state stops the supply of the first read voltage to the clamping circuit, and in a closed state provides a path for supply of the first read voltage to the clamping circuit, the first switch being controlled according to the output voltage value of the sense amplifier.

5. The memory device of claim 3, wherein when the supply of the first read voltage to the clamping circuit is stopped, a second read voltage is applied to the clamping circuit.

6. The memory device of claim 5, wherein a read operation is performed on the resistive memory cell based on the second read voltage.

7. The memory device of claim 1, wherein the access element comprises an ovonic threshold switch (OTS) connected in series with the variable resistive element, and a voltage across the resistive memory cell is adjusted by the clamping circuit to prevent a program operation while the OTS is being turned on for a read operation.

8. The memory device of claim 1, wherein the access element comprises one of a diode or a transistor connected in series with the variable resistive element.

9. A memory device comprising:
    a resistive memory cell connected to a first node, the resistive memory cell including a variable resistive element and an access element connected to the variable resistive element to control a current flow through the variable resistive element;
    a detection circuit connected to a sensing node and configured to provide a detection current to the sensing node to detect a threshold voltage of the access element;
    a clamping circuit connected between the first node and the sensing node and configured to receive a first read voltage and to ramp up a voltage of the first node;
    a sense amplifier configured to sense a voltage level of the sensing node and transition an output voltage value when the voltage level of the sensing node becomes lower than a reference voltage; and
    an adjust circuit configured to receive the first read voltage and the output voltage value of the sense amplifier and provide the first read voltage to the clamping circuit.

10. The memory device of claim 9, further comprising a discharge circuit connected to the first node and configured to discharge the first node when the detection current becomes equal to a bit line current flowing through the first node while the clamping circuit ramps up the voltage of the first node.

11. The memory device of claim 10, wherein the discharge circuit includes a transistor which is gated by the output voltage value of the sense amplifier.

12. The memory device of claim 9, wherein the adjust circuit includes a first switch configured to stop a supply of the first read voltage to the clamping circuit according to the output voltage value of the sense amplifier.

13. The memory device of claim 12, wherein the adjust circuit provides a second read voltage to the clamping circuit after the supply of the first read voltage is stopped.

14. The memory device of claim 13, wherein the adjust circuit stores a voltage level of the second read voltage, adjusts the stored voltage level of the second read voltage, and provides the adjusted second read voltage to the clamping circuit.

15. The memory device of claim 14, wherein the adjust circuit includes a capacitor for storing a voltage level of the first read voltage.

16. The memory device of claim 14, wherein the adjust circuit includes one or more switches connected to a capacitor to adjust a voltage level of the first read voltage.

17. A method for operating a memory device comprising:
    providing a resistive memory cell connected to a first node, the resistive memory cell including a variable resistive element and an access element to control a current flowing through the variable resistive element;

providing a detection current to a sensing node to detect a threshold voltage of the access element;

ramping up a voltage of the first node based on a first read voltage;

sensing a voltage level of the sensing node and transitioning an output voltage value of a sense amplifier when the voltage level of the sensing node becomes lower than a reference voltage, while ramping up the voltage of the first node; and discharging the first node when the detection current becomes equal to a bit line current flowing through the first node.

18. The method of claim 17, wherein the discharging comprises discharging the first node according to the output voltage value of the sense amplifier.

19. The method of claim 17, wherein the ramping up comprises ramping up the voltage of the first node based on a second read voltage instead of the first read voltage according to the output voltage value of the sense amplifier.

20. The method of claim 19, further comprising storing a voltage level of the second read voltage, and wherein the ramping up the voltage comprises adjusting the stored voltage level of the second read voltage and ramping up the voltage of the first node based on the adjusted second read voltage.

* * * * *